US007488570B2

(12) United States Patent
Noh et al.

(10) Patent No.: US 7,488,570 B2

(45) Date of Patent: Feb. 10, 2009

(54) METHOD OF FORMING METAL PATTERN HAVING LOW RESISTIVITY

(75) Inventors: Chang Ho Noh, Suwon-si (KR); Ki Yong Song, Seoul (KR); Jin Young Kim, Suwon-si (KR); Sung Hen Cho, Seoul (KR); Euk Che Hwang, Osan-si (KR); Tamara Byk, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 180 days.

(21) Appl. No.: 11/263,866

(22) Filed: Nov. 2, 2005

(65) Prior Publication Data

US 2006/0097622 A1 May 11, 2006

Related U.S. Application Data

(63) Continuation-in-part of application No. 10/959,435, filed on Oct. 7, 2004.

(30) Foreign Application Priority Data

Dec. 16, 2003 (KR) .............................. 2003-92112
Nov. 3, 2004 (KR) ...................... 10-2004-0088804

(51) Int. Cl.
*G03F 7/26* (2006.01)

(52) U.S. Cl. ......................... 430/315; 430/330; 430/313

(58) Field of Classification Search ................. 430/315, 430/324, 313, 330
See application file for complete search history.

(56) References Cited

U.S. PATENT DOCUMENTS 5,235,139 A 8/1993 Bengston et al.

(Continued)

FOREIGN PATENT DOCUMENTS

JP 09-260808 3/1997

(Continued)

OTHER PUBLICATIONS

Mar. 5, 2008 Official Action with English translation issued in Chinese Patent Application No. 200410081932X.

(Continued)

*Primary Examiner*—Kathleen Duda
*Assistant Examiner*—Caleen O Sullivan
(74) *Attorney, Agent, or Firm*—Buchanan Ingersoll & Rooney PC

(57) ABSTRACT

A method for forming a metal pattern with a low resistivity. The method may include the steps of: (i) coating a photocatalytic compound onto a substrate to form a photocatalytic film layer; (ii) coating a water-soluble polymeric compound onto the photocatalytic film layer to form a water-soluble polymer layer; (iii) selectively exposing the two layers to light to form a latent pattern acting as a nucleus for crystal growth; and (iv) plating the latent pattern with a metal to grow metal crystals thereon. According to the method, a multilayer wiring pattern including a low resistivity metal may be formed in a relatively simple manner at low cost, and the metals constituting the respective layers can be freely selected according to the intended application. The low resistivity metal pattern may be advantageously applied to flat panel display devices, e.g., LCDs, PDPs and ELDs.

12 Claims, 2 Drawing Sheets

U.S. PATENT DOCUMENTS

| | | | | |
|---|---|---|---|---|
| 5,534,312 | A | 7/1996 | Hill et al. | |
| 5,908,497 | A | 6/1999 | Morfesis et al. | |
| 6,294,313 | B1 | 9/2001 | Kobayashi et al. | |
| 6,344,309 | B2 | 2/2002 | Fukushima et al. | |
| 6,521,285 | B1 | 2/2003 | Biebuyck et al. | |
| 6,524,645 | B1 * | 2/2003 | Evans et al. .............. | 427/126.2 |
| 2004/0265730 | A1 | 12/2004 | Takahashi et al. | |
| 2005/0202599 | A1 | 9/2005 | Noh et al. | |
| 2006/0019182 | A1 | 1/2006 | Lee et al. | |
| 2006/0097622 | A1 | 5/2006 | Noh et al. | |
| 2006/0105251 | A1 | 5/2006 | Hwang et al. | |

FOREIGN PATENT DOCUMENTS

| | | | |
|---|---|---|---|
| JP | 11-344804 | | 12/1999 |
| JP | 2000-227643 | * | 8/2000 |
| JP | 2000-255165 | | 9/2000 |
| JP | 2002-169486 | | 6/2002 |

OTHER PUBLICATIONS

Chang-Ho Noh et al., "A Novel Patterning Method of Low-resistivity Metals", Chemistry Letters, vol. 34, No. 1, (2005), Copyright © 2005 The Chemical Society of Japan, Published on the web (Advance View) Dec. 11, 2004; DOI 10.1246/cl.2005.82.

* cited by examiner

METHOD OF FORMING METAL PATTERN HAVING LOW RESISTIVITY

CROSS-REFERENCE TO RELATED PATENT APPLICATION

This non-provisional application claims priority under 35 U.S.C. § 119(a) to Korean Patent Application Nos. 2003-92112 and 2004-88804 filed on Dec. 16, 2003, and Nov. 3, 2004, respectively, which are herein incorporated by reference. This is a continuation-in-part application of copending U.S. application Ser. No. 10/959,435, filed on Oct. 7, 2004.

BACKGROUND OF THE INVENTION

1. Field of the Invention

Embodiments of the present invention relate to a method for forming a metal pattern with a low resistivity. More particularly, embodiments of the present invention relate to a method for forming a metal pattern by sequentially forming a photocatalytic film layer composed of a photocatalytic compound (i.e., a compound whose reactivity is changed by light) and a water soluble polymer layer on a substrate, selectively exposing the two layers to light to form latent image centers for crystal growth by photoreaction, and plating the latent pattern with a desired metal to grow metal crystals on the latent pattern.

2. Description of the Related Art

With increasing demand for large display areas and flat panel displays with high resolution (e.g., liquid crystal displays (LCDs), plasma display panels (PDPs), and inorganic and organic luminescent displays (ELDs)), metal wirings are considerably extended in length. Furthermore, the design rule for increased aperture ratio is decreased. This creates several problems, such as a drastic increase in wiring resistance and capacitance as well as signal delay and distortion. Under these circumstances, the development of a process for forming metal wiring with a low resistivity is essential to developing high resolution and large area flat panel display devices.

The use of low resistivity aluminum (Al) as a wiring material has been actively discussed in large-sized LCDs. In this case, AlNd, an aluminum alloy, is used to prevent the problem of wiring non-uniformity (e.g., hillock, due to substance migration exhibited when pure Al is used). Because of an increase in resistivity caused by the addition of an alloy, however, and an increase in contact resistance by high reactivity with α-Si or ITO, a multilayer structure (e.g., Cr/AlNd/Cr) is required when an aluminum alloy is used as source/drain electrode material. However, complicated processes are required to form a multilayer metal pattern, which results in a productivity limitation.

Metals usable to form metal wirings of flat panel display devices are presented in the Periodic Table shown in Table 1 below:

TABLE 1

Summary of metals usable for metal wiring in the Periodic Table in the Elements

Legend: Atomic Number / Atomic Symbol / Resistivity (μΩcm)

- Metals currently used in LCD manufacturing industry
- Contact metal candidates
- Low-resistivity metal candidates

| Ia | IIa | IIIb | IVb | Vb | VIb | VIIb | VIII | VIII | VIII | Ib | IIb | IIIa | IVa |
|---|---|---|---|---|---|---|---|---|---|---|---|---|---|
| 3 Li 8.55 | 4 Be 4.0 | | | | | | | | | | | 5 B 1E12 | 6 C 1E19 |
| 11 Na 4.2 | 12 Mg 4.45 | | | | | | | | | | | 13 Al 2.65 | 14 Si 1E05 |
| 19 K 6.15 | 20 Ca 3.43 | 21 Sc 61.0 | 22 Ti 42.0 | 23 V 24.8 | 24 Cr 12.7 | 25 Mn 185 | 26 Fe 9.71 | 27 Co 6.24 | 28 Ni 6.84 | 29 Cu 1.67 | 30 Zn 5.92 | 31 Ga 27 | 32 Ge 1E07 |
| 37 Rb 12.5 | 38 Sr 23.0 | 39 Y 57.0 | 40 Zr 42.1 | 41 Nb 12.5 | 42 Mo 5.2 | 43 Tc 22.6 | 44 Ru 7.6 | 45 Rh 4.51 | 46 Pd 10.8 | 47 Ag 1.59 | 48 Cd 6.83 | 49 In 3.37 | 50 Sn 11.0 |
| 55 Cs 20.0 | 56 Ba 50 | 57 Lu 79.0 | 72 Hf 35.1 | 73 Ta 12.5 | 74 W 5.65 | 75 Re 19.3 | 76 Os 8.12 | 77 Co 5.3 | 78 Pt 10.6 | 79 Au 2.35 | 80 Hg 94.1 | 81 Tl 18.0 | 82 Pb 20.55 |

Aluminum alloys are currently used, but copper (Cu) and silver (Ag) have been the focus of intense interest. This is due to their low resistivity and good contact properties on an amorphous silicon layer. However, when copper or silver is used as a gate electrode, it exhibits poor adhesion to a lower substrate and thus the metal wiring tends to strip off during subsequent processes. Further, when copper or silver is used as a source or drain electrode, the atoms diffuse into an amorphous silicon layer at 200° C. or electromigration takes place due to electric drive. This causes deterioration in wiring and device properties. Accordingly, in order to use copper or silver as a wiring material having a low resistivity, there is a need to form an additional metal layer. The layer needs to have good adhesion to a substrate and a low contact resistance in the lower portion and/or the upper portion of the wiring material. This leads to a multilayer metal pattern.

In order to satisfy the need to form a large display area at a relatively low cost, it is therefore necessary to develop techniques capable of replacing conventional wiring materials with new materials such that multilayer metal wiring can be formed in a relatively simple manner.

Currently, metal patterns are formed using a photoresist. This method, however, involves complex processes, including metal sputtering, photoresist patterning and developing, and etching. It is accordingly not suitable for forming a multilayer metal pattern. In addition, there are substantial technical difficulties and increased manufacturing costs associated with the development of vacuum thin film deposition equipment for forming large area patterns on glass substrates of increased size.

U.S. Pat. No. 5,534,312 reports a method for forming a metal pattern without the necessity of an etching process. The method involves the following steps: coordinately binding an organic compound, which is susceptible to light, to a metal thereby producing an organometallic compound; coating the organometallic compound onto a substrate; and, irradiating the organometallic compound with light without application of a photosensitive resin. In this method, when the coated substrate is exposed to light through a patterned mask, the light directly reacts with the organometallic compound resulting in the decomposition of organic ligands coordinately bonded to the metal. The decomposition separates the ligands from the metal. The metal atoms react with adjacent metal atoms or ambient oxygen, and eventually a pattern of a metal oxide film is formed. The method is problematic, however, due to ligand contamination. Most of the ligands are separated by photoreaction in order to form the metal or metal oxide film. Furthermore, in connection with improving the electrical conductivity of the oxide film, the method disadvantageously involves reduction and surface annealing at 200° C. or higher for 30 minutes to several hours with a flow of a mixed gas of hydrogen and nitrogen.

Another method for forming a metal wiring by an ink-jet process is described in Japanese Patent Laid-open No. Hei 2002-169486. But, this method has problems of low resolution and difficult formation of highly electrically conductive wiring. Furthermore, U.S. Pat. No. 6,521,285 discusses the formation of metal wiring by micro-contact printing and electroless plating. This approach, however, has a disadvantage in that uniform metal wiring usable in a large area flat panel display device is seldom formed.

There is therefore a need in the art for a simple method that enables the formation of a multilayer metal pattern including a highly electrically conductive metal.

OBJECTS AND SUMMARY

The present inventors have found that a single-layer or multilayer metal pattern including a highly electrically conductive metal may be formed in a simple manner. This is accomplished by: sequentially forming a photocatalytic film layer composed of a compound whose reactivity is changed by light (i.e., a photocatalytic compound), and a water-soluble polymer layer on a substrate; selectively exposing the two layers to light to form latent image centers for crystal growth (via photoreaction); and, plating the latent pattern with a desired metal to grow metal crystals on the latent pattern. In addition, the present inventors have found that the metal pattern possesses excellent metal wiring properties.

A feature of embodiments of the present invention, therefore, is to provide a method for forming a single layer or multilayer metal pattern in a rapid, efficient and simple manner. The method is performed without the need for a metal thin film forming process requiring high vacuum or high temperature conditions. Furthermore, the method does not involve a photoresist process for forming a fine pattern or a subsequent etching process.

A further feature of embodiments of the present invention is to provide a flat panel display device that is manufactured using a metal pattern formed by the method.

In accordance with the features of embodiments of the present invention, there is provided a method for forming a metal pattern comprising the steps of (i) coating a photocatalytic compound onto a substrate to form a photocatalytic film layer; (ii) coating a water-soluble polymeric compound onto the photocatalytic film later to form a water-soluble polymer layer; (iii) selectively exposing the two layers to light to form latent image centers for crystal growth; and (iv) plating the latent pattern with a metal to grow metal crystals thereon.

According to embodiments of the present invention, there is further provided a metal pattern formed by the method.

According to embodiments of the present invention, there is further provided a flat panel display device comprising the metal pattern as a metal wiring.

According to embodiments of the present invention, there is yet further provided a flat panel display device comprising the metal pattern as an electromagnetic interference filter.

BRIEF DESCRIPTION OF THE DRAWINGS

The above and other objects, features and other advantages of embodiments of the present invention will be more clearly understood from the following detailed description taken in conjunction with the accompanying drawings, in which.

DETAILED DESCRIPTION OF THE PREFERRED EMBODIMENTS

Figure 1:
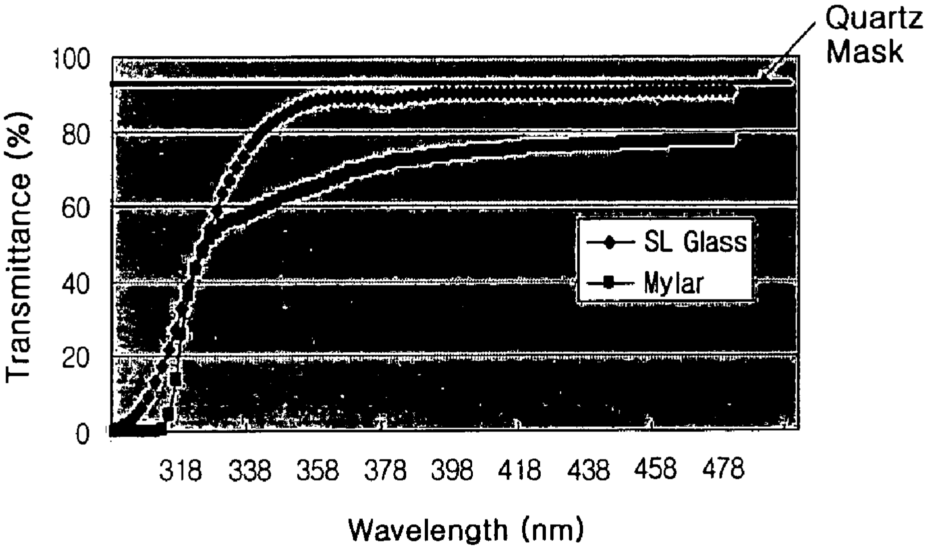
FIG. 1 is a graph showing change in UV transmittance according to photomasks used in embodiments of the present invention.

Hereinafter, embodiments of the present invention will be explained in more detail, based on the respective steps.

Step (i):

In this step, a photocatalytic compound is coated onto a substrate to form a transparent amorphous photocatalytic film layer on the substrate.

The term “photocatalytic compound” as used herein refers to a compound whose characteristics are changed by light.

An exemplary compound is one which is inactive when not exposed to light, but is activated upon exposure to light, e.g., UV light. For example, electrons of an exposed portions of a photocatalytic compound may be excited upon exposure to UV light, and thus may exhibit activity, for example, reducing ability. Accordingly, reduction of metal ions in the exposed portions may take place and thus a negative-type latent pattern may be formed on the exposed portion.

Preferred examples of photocatalytic compounds include any Ti-containing organometallic compound which can form transparent amorphous $TiO_2$ by annealing, e.g., tetraisopropyltitanate, tetra-n-butyltitinate, tetrakis(2-ethyl-hexyl)titanate, polybutyltitanate and the like.

After dissolving the photocatalytic compound in an appropriate solvent such as isopropyl alcohol, the coating of the solution onto the substrate may be conducted by spin coating, spray coating, screen printing or the like.

Examples of substrates usable in embodiments of the present invention include, but are not limited to, transparent plastic and glass materials. Examples of the transparent plastic substrate include, but are not limited to, acrylic resins, polyesters, polycarbonates, polyethylenes, polyethersulfones, olefin maleimide copolymers, norbornene-based resins. In the case where excellent heat resistance is required, olefin maleimide copolymers and norbornene-based resins are preferred. Otherwise, it is preferred to use polyester films, acrylic resins and the like.

A 30-1,000 nm thick coating layer may be formed by the coating of the photocatalytic compound. After coating, the coating layer may be heated on a hot plate or in a convection oven at a temperature preferably not higher than 200° C. for up to 20 minutes to form the desired photocatalytic film layer. Heating at a temperature exceeding 200° C. may lead to formation of a crystalline $TiO_2$ layer, thus resulting in poor optical properties and patterning profile.

Step (ii):

In this step, a water-soluble polymeric compound is coated onto the photocatalytic film layer to form a water-soluble polymer layer thereon. Examples of water-soluble polymeric compounds used herein include, but are not limited to, homopolymers, such as polyvinylalcohols, polyvinylphenols, polyvinylpyrrolidones, polyacrylic acids, polyacrylamides, gelatins, etc., and copolymers thereof.

First, 2-30% by weight of the water-soluble polymeric compound may be dissolved in water. Thereafter, the resulting solution may be coated onto the photocatalytic film layer, followed by heating, to form a water-soluble polymer layer.

The water-soluble polymer layer thus formed may play a roll in promoting photoreduction upon exposure to UV light, and in acting to improve the photocatalytic activity.

Preferably, a photosensitizer may be added to the water-soluble polymer layer in order to further increase its photosensitivity. Examples of the photosensitizer include, but are not limited to, a water-soluble compound selected from colorants, organic acids, organic acid salts and organic amines. Examples of photosensitizers include, but are not limited to, tar colorants, potassium and sodium salts of chlorophylline, riboflavine and derivatives thereof, water-soluble annatto, $CuSO_4$, caramels, curcumine, cochinal, citric acid, ammonium citrate, sodium citrate, oxalic acid, K-tartrate, Na-tartrate, ascorbic acid, formic acid, triethanolamine, monoethanolamine, malic acid, silver salts, silver halides and the like.

The amount of the photosensitizer added may be in the range of 0.01-50 parts by weight, based on 100 parts by weight of the water-soluble polymeric compound.

Thereafter, the water-soluble polymer layer may be heated at a temperature preferably not higher than 100° C. for 5 minutes or less to evaporate water. The thickness of the final water-soluble polymer layer may be controlled to the range of 0.1~1 μm.

More specifically, polyvinylalcohols may be used as a water-soluble polymeric compound and triethanolamine may be used as a photosensitizer. Alternatively, gelatins may be used as a water-soluble polymeric compound and silver salts or silver halides may be used as a photosensitizer.

Step (iii):

In this step, the photocatalytic film layer and the water-soluble polymer layer are selectively exposed to light to form latent image centers for crystal growth thereon. Exposure atmosphere and exposure dose are not especially limited, and may be properly selected according to the kind of photocatalytic compound used. The activated photocatalytic pattern acts as a nucleus for metal crystal growth in a subsequent plating step.

In case that silver salts or silver halides are used as a photosensitizer with a water-soluble polymer, exposure may proceed with a broad wavelength light, and thus conventional UV process may be applied. Furthermore, when silver salts or a silver halides are used as a photosensitizer, since the transmittance of the water-soluble polymer layer to a glass photomask at general UV wavelength is good, an advantage of cost efficiency can be obtained by using glass photomasks instead of expensive quartz photomasks.

If silver salts or silver halides are used as a photosensitizer, an additional development step may be followed after the exposure step. This may enhance photosensitivity of a $TiO_2$ layer and removes extra silver ions attached on the non-exposured $TiO_2$ layer, and thus the resolution of the pattern may be further improved.

The latent pattern may be treated with a metal salt solution to form a catalyst pattern thereon, in order to more effectively form a metal pattern in subsequent step (iv). Examples of the metal salt solution include, but are not limited to, a silver (Ag) salt solution, a palladium (Pd) salt solution or a mixed solution thereof. At this time, additives to the solution of water-soluble polymer and photosensitizer may be completely dissolved and removed in a silver (Ag) salt solution or a palladium (Pd) salt solution and removed. When a silver salts or a silver halide is used as a photosensitizer and the metal pattern is deposited in a palladium (Pd) salt solution, Pd particles may be deposited on a latent Ag pattern with enhanced catalytic activity, and relatively larger Ag particles may be formed, thereby catalytic activity and selectivity of the nucleus for latent pattern may be increased Step (iv):

In this step, the latent image centers for crystal growth formed in step (iii), or if desired, the catalyst pattern, are subjected to metal-plating to grow metal crystals on the patterned nuclei for crystal growth, thereby forming a metal pattern. The metal-plating may be performed by an electroless or electroplating process. A catalyst pattern formed by treating the latent pattern with the metal salt solution may have a sufficient activity upon electroless-plating that crystal growth may be accelerated and thus a more densely packed metal pattern may be advantageously formed.

It is to be understood that, upon forming the metal pattern, at least two layers of metal crystals may be grown on latent image centers for crystal growth by continuous plating to form a multilayer metal pattern. For example, latent image centers for crystal growth may be plated with a desired metal to form a first metal layer, and then the first metal layer may be plated with another desired metal to form a second metal layer only on the portions where the first metal layer is formed, thereby facilitating the formation of a multilayer metal pattern.

The kind of plating metals used and the plating order may be suitably chosen depending on the intended application. The metals constituting each metal layer may be identical to or different from each other. The thickness of the metal layers may be properly controlled.

In order to form a metal pattern having a low resistivity, it is preferred to consider the adhesion to a substrate and the contact properties between a substrate and an insulating film. In embodiments of the present invention, a metal such as Ni, Pd, Sn or Cr, or an alloy thereof is preferably used to form a first metal layer, and a highly electrically conductive metal such as Cu, Ag or Au, or an alloy thereof is preferably used to form a second metal layer. At this time, first and second metal layers are preferably formed to have a thickness of 0.1-1 μm and 0.3-20 μm, respectively. Nickel is preferably used to form the first metal layer and Ag or Cu is preferably used to form the second metal layer in terms of low price and ease of formation.

When a highly electrically conductive second metal layer is brought into contact with ITO (indium tin oxide) or a semiconductor component, it may be plated with Ni, Pd, Sn, Cr or an alloy thereof to form a third metal layer in order to improve the contact resistance between the second metal layer and the ITO or the semiconductor component. In a case where Cu is used to form the highly electrically conductive second metal layer, a noble metal such as Ag or Au may be used to form a third metal layer in order to, for example, prevent deterioration in physical properties of the second metal layer due to the formation of an oxide film on the surface.

Alternatively, a third metal layer may be formed by plating the second metal layer with the metal used to form the first metal layer in order to improve the contact resistance.

Various plating processes may be appropriately combined to form the multilayer metal layers. For example, when a first metal layer is formed on an insulating film, an electroless-plating process may be employed. On the other hand, when Cu or Ag is used to form a second metal layer, an electroless or electro-plating process may be employed.

The electroless or electro-plating may be achieved by a well-known procedure, and commercially available plating compositions may be used for plating. In an electroless-plating process, the substrate on which Pd or Ag nucleus catalyst for crystal growth is formed may be dipped in a plating solution containing 1) a metal salt, 2) a reducing agent, 3) a complexing agent, 4) a pH-adjusting agent, 5) a pH buffer and 6) a modifying agent. The metal salt of 1) serves as a source providing metal ions. Examples of the metal salt include, but are not limited to, chlorides, nitrates, sulfates and acetates of the corresponding metal. The reducing agent of 2) acts to reduce metal ions present on the substrate. Examples of the reducing agent include, but are not limited to, $NaBH_4$, $KBH_4$, $NaH_2PO_2$, hydrazine, formaline and polysaccharides (e.g., glucose). $NaH_2PO_2$ is preferably used for a nickel plating solution, and formaline and polysaccharides are preferably used for a Cu or Ag plating solution. The complexing agent of 3) functions to prevent the precipitation of hydroxides in an alkaline solution and to control the concentration of free metal ions, thereby preventing the decomposition of metal salts and adjusting the plating speed. Examples of the complexing agent include, but are not limited to, ammonia solution, acetic acid, guanine acid, tartaric acid, chelating agents (e.g., EDTA) and organic amine compounds. Chelating agents (e.g., EDTA) are preferred. The pH-adjusting agent of 4) plays a roll in adjusting the pH of the plating solution, and may be selected from acidic or basic compounds. The pH buffer of 5) inhibits the sudden change in the pH of the plating solution, and may be selected from organic acids and weakly acidic inorganic compounds. The modifying agent of 6) is a compound capable of improving coating and planarization characteristics. Examples of the modifying agent include, but are not limited to, common surfactants and adsorptive substances capable of adsorbing components interfering with the crystal growth.

In an electroplating process, a plating solution having a composition comprising 1) a metal salt, 2) a complexing agent, 3) a pH-adjusting agent, 4) a pH buffer and 5) a modifying agent, may be used. The functions and the specific examples of the components contained in the plating solution composition may be as defined above in the electroless-plating process.

A low resistivity metal pattern formed by embodiments of the present invention may be useful as a metal wiring or an electromagnetic interference filter of flat panel display devices such as LCDs, PDPs and ELDs.

Embodiments of the present invention will now be described in more detail with reference to the following preferred examples. However, these examples are given for the purpose of illustration and are not to be construed as limiting the scope of the invention.

Formation of Latent Image Centers for Crystal Growth I

After a solution of polybutyltitanate (2.5 wt %) in isopropanol was coated onto a transparent polyester film as a substrate by spin coating, the resulting coating layer was dried at 150° C. for 5 minutes so as to have a $TiO_2$ film with a thickness of about 100 nm. Separately, 1 part by weight of triethanolamine as a photosensitizer was added to an aqueous solution of a polyvinylalcohol polymer (5 wt %) having a molecular weight of 25,000 (Polyscience), based on 100 parts by weight of the polymer, followed by stirring. The resulting mixture was coated onto the polybutyltitanate coating layer and dried at 60° C. for 2 minutes to prepare a photocatalytic film layer. UV light having a broad wavelength range was irradiated to the photocatalytic film layer through a quartz photomask on which a minute pattern (resolution: 5 μm) was formed using a UV exposure system (Oriel, U.S.A). After exposure, the substrate was dipped in a solution of 0.6 g of $PdCl_2$ and 1 ml of HCl in 11 of water to deposit Pd particles on the surface of the exposed portion. As a result, a substrate (1) formed a Pd-deposited negative pattern acting as nucleus for crystal growth thereon was obtained.

Formation of Latent Image Centers for Crystal Growth II

After a solution of polybutyltitanate (2.5 wt %) in isopropanol was coated onto a transparent polyester film as a substrate by spin coating, the resulting coating layer was dried at 150° C. for 5 minutes so as to have a thickness of about 100 nm. Separately, 5 wt % of $AgNO_3$ solution (5 wt %) as a photosensitizer was added to an aqueous solution of a polymer (1 L) including 5 g of gelatin, 40 g of citric acid, 0.1 g of cationic surfactant (4-octylbenzenesulfonate salt), and 200 ml of isopropyl alcohol, followed by stirring. The resulting mixture was coated onto the polybutyltitanate coating layer and dried at 50° C. for 3 minutes to prepare a photocatalytic film layer. UV light having a broad wavelength of 300 nm was irradiated to the photocatalytic film layer through a quartz photomask on which a minute pattern (resolution: 5 μm) was formed using a UV exposure system (Oriel, U.S.A). The transmittance to UV of the photomask is shown in FIG. 1. After exposure, the substrate was developed by using a developing solution (1 L) of 5 g of Metol (p-methylamnophenol sulfate), 10 g of $Na_2SO_3$, and 5 g of ammonium citrate. Thereafter, the substrate was dipped in a solution of 0.3 g of $PdCl_2$ and 10 g of KCl in 1 L of water to deposit Pd particles on the surface of the exposed portion. As a result, a substrate (2) formed a Pd-deposited negative pattern acting as nucleus for crystal growth thereon was obtained Formation of Latent Image Centers for Crystal Growth III After a solution of polybutyltitanate (2.5 wt %) in isopropanol was coated onto a transparent polyester film as a substrate by spin coating, the resulting coating layer was dried at 150° C. for 5 minutes so as to have a thickness of about 100 nm. Separately, 5 wt % of $AgNO_3$ solution as a photosensitizer was added to an aqueous solution of a polymer (1 L) including 5 g of gelatin, 40 g of citric acid, 0.1 g of cationic surfactant (4-octylbenzenesulfonate salt), and 200 ml of isopropyl alcohol, followed by stirring. The resulting mixture was coated onto the polybutyltitanate coating layer and dried at 50° C. for 3 minutes to prepare a photocatalytic film layer. UV light having a broad wavelength of 360 nm was irradiated to the photocatalytic film layer through a glass photomask on which a minute pattern (resolution: 5 μm) was formed using a UV exposure system (Oriel, U.S.A). The transmittance to UV of this photomask is shown in FIG. 1. After exposure, the substrate was developed by using a developing solution (1 L) of 5 g of Metol (p-methylamnophenol sulfate), 10 g of $Na_2SO_3$, and 5 g of ammonium citrate. Thereafter the substrate was dipped in a solution of 0.3 g of $PdCl_2$ and 10 g of KCl in 1 L of water to deposit Pd particles on the surface of the exposed portion. As a result, a substrate (3) formed a Pd-deposited negative pattern acting as nucleus for crystal growth thereon was obtained.

EXAMPLE 1

Figure 2:
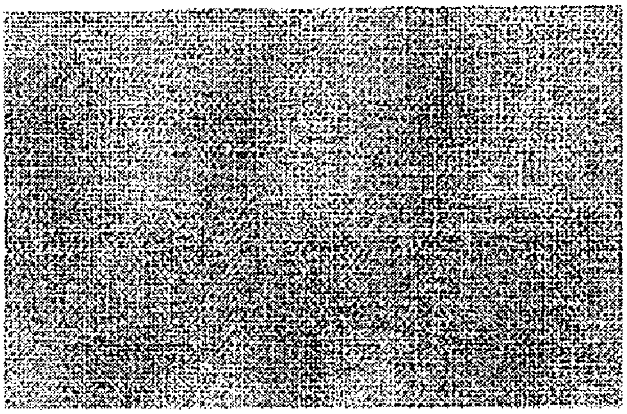
FIG. 2 is an optical microscope image of a metal pattern formed in Example 1.

Formation of Negative-type Copper Wiring by Electroless Nickel Plating and Electroless Copper Plating The substrate (1) prepared above was dipped in an electroless nickel plating solution to grow crystals of a patterned nickel wiring. The nickel wiring pattern was dipped in an electroless copper plating solution to form a negative-type two-layer nickel-copper wiring pattern. At this time, the electroless nickel plating solution and the copper plating solution were prepared so as to have the compositions (a) and (b) indicated in Table 2 below, respectively. The basic physical properties of the metal pattern are shown in Table 3 below. The thickness of the pattern was measured using α-step (manufactured by Dektak), and the resistivity was measured using a 4-point probe. The resolution (line width) was determined using an optical microscope, and the adhesive force was confirmed by a scotch tape peeling test. An optical microscope image of the metal pattern is shown in FIG. 2.

EXAMPLE 2

Figure 3:
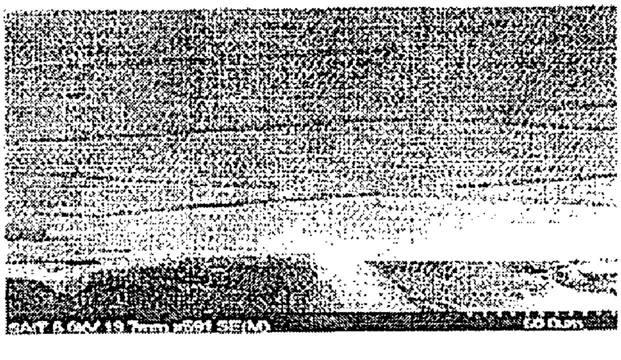
FIG. 3 is an electron microscope image of a metal pattern formed in Example 2.

Formation of Negative-type Copper Wiring by Electroless Nickel Plating and Electro Copper Plating The substrate (1) prepared above was formed was dipped in an electroless nickel plating solution to selectively grow crystals of a nickel wiring. The nickel wiring pattern was dipped in an electro copper plating solution and then an electric current (0.15 A) was applied to the plating solution to form a negative-type two-layer nickel-copper wiring pattern. The electroless nickel plating solution and the electro copper plating solution were prepared so as to have the compositions (a) and (c) indicated in Table 2 below, respectively. The basic physical properties of the metal pattern are shown in Table 3 below. An electron microscope image of the metal pattern is shown in FIG. 3.

EXAMPLE 3

Figure 4:
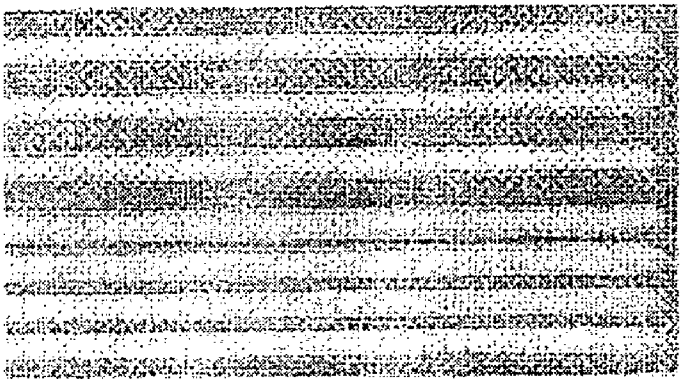
FIG. 4 is an optical microscope image of a metal pattern formed in Example 3.

Formation of Negative-type Silver Wiring by Electroless Nickel Plating and Electroless Silver Plating The substrate (1) prepared above was dipped in an electroless nickel plating solution to grow crystals of a nickel wiring. At this time, the electroless nickel plating solutions were prepared so as to have the composition (a) indicated in Table 2 below. The nickel wiring pattern was dipped in an electroless silver plating solution (S-700, Kojundo Chemical, Co., Ltd., Japan) to form a negative-type two-layer nickel-silver wiring pattern. The basic physical properties of the metal pattern are shown in Table 3 below. An optical microscope image of the metal pattern is shown in FIG. 4.

EXAMPLE 4

Formation of Nickel Plating by Electroless Nickel Plating (I)

Figure 5:
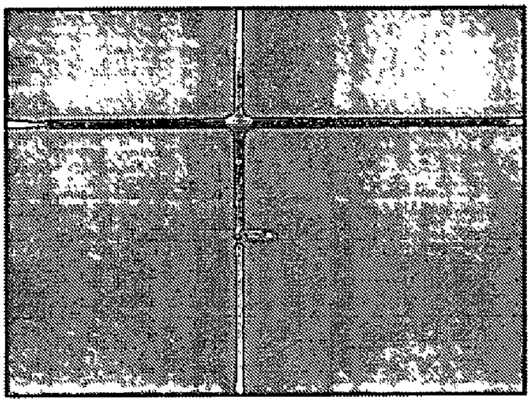
FIG. 5 is an optical microscope image of a metal pattern formed in Example 4.

The substrate (2) prepared above was dipped in an electroless nickel plating solution to grow crystals of a nickel wiring. At this time, the electroless nickel plating solutions were prepared so as to have the composition (d) indicated in Table 2 below. The physical properties of the nickel pattern crystal formed by exposing the $TiO_2$ layer linked with silver ions by means of a Quartz photomask are shown in Table 4 below. An optical microscope image of the metal pattern is shown in FIG. 5.

EXAMPLE 5

Formation of Nickel Plating by Electroless Nickel Plating (II)

Figure 6:
FIG. 6 is an optical microscope image of a metal pattern formed in Example 5.

The substrate (3) prepared above was dipped in an electroless nickel plating solution to grow crystals of a nickel wiring. At this time, the electroless nickel plating solutions were prepared so as to have the composition (d) indicated in Table 2 below. The physical properties of the nickel pattern crystal formed by exposing the $TiO_2$ layer linked with silver ions by means of a glass photomask are shown in Table 4 below. An optical microscope image of the metal pattern is shown in FIG. 6.

TABLE 2

| (a) Electroless nickel plating solution | (b) Electroless copper plating solution | (c) Electro copper plating solution | d) Electroless copper plating solution |
|---|---|---|---|
| $NiCl_2$•$6H_2O$ 10 g<br>$NaH_2PO_2$•$2H_2O$ 30 g<br>$NaCH_3COO$ 10 g<br>$NH_4Cl$ 40 g<br>Water 1 L | $CuSO_4$•$5H_2O$ 12 g<br>$KNaC_4H_4O_6$•$6H_2O$ 55 g<br>NaOH 18 g<br>$Na_2CO_3$ 10 g<br>$Na_2S_2O_3$•$5H_2O$ 0.0002 g<br>$CH_2O$ (40%) 20 ml<br>Wate 1 L | $CuSO_4$•$5H_2O$ 72 g<br>$H_2SO_4$ 230 g<br>HCl 0.125 g<br>OKUNO Lucina 10 g<br>Water 1 L | $Ni(CH_3COO)_2$•$4H_2O$ 10 g<br>$NH_4CH_3COO$ 20 g<br>$NaH_2PO_2$•$H_2O$ 20 g<br>Water 1 L |

TABLE 3

| Example No. | Metal thickness (μm) | Resistivity (μΩ-cm) | Resolution (μm) | Adhesive force |
|---|---|---|---|---|
| Example 1 | 0.4 | 2.7 | <8 | Good |
| Example 2 | 1.5 | 2.0 | <10 | Good |
| Example 3 | 0.3 | 2.5 | <8 | Good |

TABLE 4

| Example No. | Resolution (μm) | Metal thickness (μm) |
|---|---|---|
| Example 4 | <8 | 0.1 |
| Example 5 | <8 | 0.13 |

According to a method of embodiments of the present invention, single layer and multilayer metal patterns may be formed by forming a photocatalytic thin film by means of a simple coating process (instead of a conventional physical deposition) followed by light exposure and simple plating treatment. Accordingly, embodiments of the present invention may provide a method for effectively forming single layer and multilayer metal patterns having a low resistivity in a rapid, efficient and simple manner without the necessity of a sputtering process requiring high vacuum conditions, a photopatterning process using a photosensitive resin and an etching process. A low resistivity metal pattern formed by the method of embodiments of the present invention may be advantageously applied to flat panel display devices.

Although the preferred embodiments of embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a metal pattern, comprising the steps of:

(i) coating a photocatalytic compound onto a substrate to form a photocatalytic film layer wherein the photocatalytic compound is a Ti-containing organometallic compound which is capable of being converted to transparent amorphous $TiO_2$ by annealing;

(ii) heating the coated substrate at a temperature not higher than 200° C. under conditions wherein the Ti-containing organometallic compound present on the substrate is converted to a transparent photocatalytic film layer of amorphous $TiO_2$;

(iii) coating a water-soluble polymeric compound comprising a photosensitizer selected from at least one of silver salts and silver halides onto the photocatalytic film layer of transparent amorphous $TiO_2$ to form a water-soluble polymer layer thereon;

(iv) selectively exposing the two layers to light to form latent image centers for crystal growth; and (v) plating the resulting latent pattern with a metal to grow metal crystals thereon wherein the electrons of the photocatalytic compound are excited upon exposure to light such that the photocatalytic compound has activity.

2. The method according to claim 1, wherein the Ti-containing organometallic compound is tetraisopropyltitanate, tetra-n-butyltitinate, tetrakis(2-ethyl-hexyl)titanate or polybutyltitanate.

3. The method according to claim 1, wherein the water-soluble polymeric compound is at least one polymer selected from the group consisting of polyvinylalcohols, polyvinyiphenols, polyvinylpyrrolidones, polyacrylic acids, polyacrylamides, gelatins and copolymers thereof.

4. The method according to claim 1, wherein the photosensitizer present with said water-soluble polymer layer further comprises colorants, organic acids, organic acid salts or organic amines.

5. The method according to claim 1, wherein the photosensitizer present with said water-soluble polymer layer further comprises tar colorants, potassium and sodium salts of chlorophylline, riboflavine and derivatives thereof, water-soluble annatto, $CuSO_4$, caramels, curcumine, cochineal, citric acid, ammonium citrate, sodium citrate, oxalic acid, K-tartrate, Na-tartrate, ascorbic acid, formic acid, triethanolamine, monoethanolamine, or malic acid.

6. The method according to claim 1, further comprising the step of treating latent image centers for crystal growth formed in step (iv) with a metal salt solution to form a catalyst pattern on the latent pattern.

7. The method according to claim 1, wherein in step (vii) the latent pattern is electroless-plated with Ni, Pd, Sn, Cr or an alloy thereof to form a first metal pattern, and then the first metal pattern is electro- or electroless-plated with Cu, Ag, Au or an alloy thereof to form a second metal pattern.

8. The method according to claim 1, wherein the photosensitizer is present in the range of 0.01 to 50 parts by weight based on 100 parts by weight of the water-soluble polymeric compound.

9. The method according to claim 1, wherein the thickness of the final water-soluble polymer layer formed in step (iii) is 0.1 to 1 μm.

10. A method for forming a metal pattern, comprising the steps of:

(i) coating a photocatalytic compound onto a substrate to form a photocatalytic film layer wherein the photocatalytic compound is a Ti-containing organometallic compound which is capable of being converted to amorphous $TiO_2$ by annealing;

(ii) heating the coated substrate at a temperature not higher than 200° C. under conditions wherein the Ti-containing organometallic compound present on the substrate is converted to a transparent photocatalytic film layer of amorphous $TiO_2$;

(iii) coating a water-soluble polymeric compound comprising a photosensitizer selected from at least one of silver salts and silver halides onto the photocatalytic film layer of transparent amorphous $TiO_2$; to form a water-soluble polymer layer thereon;

(iv) selectively exposing the two layers to light to form latent image centers for crystal growth; and (v) treating said latent image centers with a metal salt solution to form a catalyst pattern on said latent image centers;

(vi) developing the coated substrate; and (vii) plating the latent pattern with a metal to grow metal crystals thereon.

11. The method according to claim 10, wherein the metal salt solution of step (v) is a palladium (Pd) salt solution, a silver (Ag) salt solution, or a mixed solution thereof.

12. A method for forming a metal pattern, comprising the steps of:

(i) coating a photocatalytic compound onto a substrate to form a photocatalytic film layer wherein the photocatalytic compound is a Ti-containing organometallic compound which is capable of being converted to transparent amorphous $TiO_2$ by annealing;

(ii) heating the coated substrate at a temperature not higher than 200° C. under conditions wherein the Ti-containing organometallic compound present on the substrate is converted to a transparent photocatalytic film layer of amorphous $TiO_2$;

(iii) coating a water-soluble polymeric compound comprising a photosensitizer selected from at least one of silver salts and silver halides onto the photocatalytic film layer of transparent amorphous $TiO_2$ to form a water-soluble polymer layer thereon;

(iv) selectively exposing the two layers to light to form latent image centers for crystal growth; and (v) plating the latent pattern with a metal to grow metal crystals thereon, wherein the latent pattern is electroless-plated with Ni, Pd, Sn, Cr or an alloy thereof to form a first metal pattern, and then the first metal pattern is electro- or electroless-plated with Cu, Ag, Au or an alloy thereof to form a second metal pattern, and wherein the second metal pattern is plated with Ni, Pd, Sn, Cr or an alloy thereof to form a third metal pattern.

* * * * *